(12) United States Patent
Mashino (10) Patent No.: US 7,655,504 B2
(45) Date of Patent: Feb. 2, 2010

(54) SEMICONDUCTOR DEVICE AND METHOD OF MANUFACTURING THE SAME

(75) Inventor: Naohiro Mashino, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/153,313

(22) Filed: May 16, 2008

(65) Prior Publication Data

US 2008/0233677 A1 Sep. 25, 2008

Related U.S. Application Data

(62) Division of application No. 10/445,821, filed on May 28, 2003, now abandoned.

(30) Foreign Application Priority Data

Jun. 14, 2002 (JP) .............................. 2002-174285

(51) Int. Cl.
*H01L 21/00* (2006.01)
(52) U.S. Cl. ................ 438/109; 438/455; 361/790; 174/255; 257/E21.503
(58) Field of Classification Search .................. None
See application file for complete search history.

(56) References Cited

U.S. PATENT DOCUMENTS

| | | | |
|---|---|---|---|
| 5,404,044 A | 4/1995 | Booth et al. | 257/698 |
| 5,758,413 A * | 6/1998 | Chong et al. | 29/852 |
| 5,902,118 A | 5/1999 | Hübner | 438/106 |
| 6,424,050 B1 | 7/2002 | Komiyama | 257/777 |
| 6,444,493 B1 | 9/2002 | Feil et al. | 438/108 |
| 6,577,013 B1 | 6/2003 | Glenn et al. | 257/777 |
| 6,608,371 B2 | 8/2003 | Kurashima et al. | 257/686 |
| 6,620,731 B1 | 9/2003 | Farnworth | 438/667 |
| 6,624,921 B1 | 9/2003 | Glenn et al. | 359/291 |

(Continued)

FOREIGN PATENT DOCUMENTS

DE 198 56 573 C1 5/2000

(Continued)

OTHER PUBLICATIONS

European Search Report dated Dec. 29, 2006.

(Continued)

*Primary Examiner*—W. David Coleman
*Assistant Examiner*—Shaka Scarlett
(74) *Attorney, Agent, or Firm*—Krantz, Quintos & Hanson, LLP (57) ABSTRACT

Two semiconductor substrates are first bonded together by means of a metal bump, while respective one-side surfaces on which device patterns are formed are faced each other, and a resin is then filled into a gap between the respective one-side surfaces and thereafter each of the semiconductor substrates is polished and thinned to a prescribed thickness. Furthermore, a via hole and an insulating film are formed; part of a portion in contact with the metal bump, of the insulating film, is opened; the inside of the via hole is filled with a conductor; and an electrode pad is formed on the conductor, to thereby form structures. Finally, a required number of structures are electrically connected with each other through the electrode pad and stacked to thereby obtain a semiconductor device.

8 Claims, 7 Drawing Sheets

U.S. PATENT DOCUMENTS

| | | | |
|---|---|---|---|
| 6,737,750 B1 | 5/2004 | Hoffman et al. | 257/777 |
| 6,740,981 B2 | 5/2004 | Hosomi | 257/778 |
| 6,759,668 B2 | 7/2004 | Matsuo et al. | 250/551 |
| 6,825,055 B2 | 7/2004 | Matsuo et al. | 250/551 |
| 6,812,549 B2 | 11/2004 | Umetsu et al. | 257/621 |
| 7,074,703 B2 | 7/2006 | Fukazawa | 438/598 |
| 2001/0005059 A1 | 6/2001 | Koyanagi et al. | 257/778 |
| 2002/0003297 A1 | 1/2002 | Smola et al. | 257/700 |
| 2002/0004258 A1 | 1/2002 | Nakayama et al. | 438/107 |
| 2002/0074637 A1 | 6/2002 | McFarland | 257/686 |
| 2002/0074639 A1 | 6/2002 | Kim et al. | 257/686 |
| 2002/0131247 A1* | 9/2002 | Cooray | 361/750 |
| 2002/0152611 A1* | 10/2002 | Tung et al. | 29/846 |
| 2002/0153602 A1 | 10/2002 | Tay et al. | 257/685 |
| 2003/0042595 A1 | 3/2003 | Canella | 257/690 |
| 2003/0141582 A1 | 7/2003 | Yang et al. | 257/686 |

FOREIGN PATENT DOCUMENTS

| | | |
|---|---|---|
| EP | 1 094 511 A2 | 4/2001 |
| EP | 1 187 211 A2 | 3/2002 |
| JP | 59-48950 | 3/1984 |
| JP | 2002-124531 | 4/2002 |

OTHER PUBLICATIONS

Taiwanese Office Action having a date of receipt of Oct. 5, 2006, and a partial English-language translation.

* cited by examiner

SEMICONDUCTOR DEVICE AND METHOD OF MANUFACTURING THE SAME

This application is a divisional application of prior application Ser. No. 10/445,821, filed on May 28, 2003 now abandoned.

BACKGROUND OF THE INVENTION

1. Field of the Invention

The present invention relates to a semiconductor device and its manufacturing method and, more particularly, to a technique adapted to eliminate drawbacks arising in association with a thinning in performing three-dimensional mounting intended for the high density design and multiple-pin design of semiconductor devices.

2. Description of the Related Art

Conventionally, various methods have been proposed as techniques for accomplishing the high density design and multiple-pin design of semiconductor devices. As one method, for example, there is an available method which involves fabricating a printed wiring board of multilayer structure by means of a build-up method and mounting elements such as semiconductor chips on the multilayer printed wiring board so as to obtain a device.

Also, as another method, there is an available method which involves, instead of fabricating a printed wiring board of multilayer structure, fabricating a printed wiring board by forming wiring patterns on both sides of one insulative substrate, fabricating a device by mounting elements such as semiconductor chips on the wiring patterns of one surface of the printed wiring board, and performing three-dimensional mounting by stacking such devices. According to this method, it is necessary to electrically interconnect the respective semiconductor chips mounted on each of the printed wiring boards. To this end, in each of the printed wiring boards are formed through holes which pierce the printed wiring board, and wiring patterns formed on both surfaces of the printed wiring board are electrically interconnected through plated films (conductor layers) formed on the inner surfaces of the through holes.

Also, as still another method of performing three-dimensional mounting, there is a conceivable method which involves: using a silicon (Si) substrate as a base material layer; forming a hole with a required depth in the silicon substrate; forming required device patterns (including circuit patterns, wiring patterns, or the like) after filling the hole with a conductor by plating, or the like, so that the device patterns are electrically connected to the conductor; covering the device patterns with insulating films formed of polyimide resin, or the like; exposing the conductor by polishing the back surface of the silicon substrate by means of a back-grinding method, or the like; fabricating a device by providing metal bumps (external connection terminals) on the exposed conductor; and stacking a required number of devices.

Likewise in this method, it is necessary to electrically interconnect each of the devices, and to this end, it is necessary to form through holes in the insulating film of the device, plate the inner surfaces of the through holes, and electrically connect device patterns via the plated film to metal bumps of an upper-positioned device.

As described above, various techniques have been proposed as techniques for accomplishing the high density design and multiple-pin design of semiconductor devices. Among these, in the technique utilizing a build-up method, the thickness of the printed wiring board is considerably increased because the printed wiring board is fabricated to have a multilayer structure. Accordingly, the scale of the whole semiconductor device in final form becomes large, resulting in a problem in that it is not possible to fully meet the recent requirement for thinning design.

Also, the method which involves forming a device by means of an insulative substrate and stacking a required number of devices, is favorable in terms of the high density design and multiple-pin design, compared with the above technique utilizing a build-up method, because a plurality of semiconductor chips are mutually three-dimensionally mounted. However, this method has a drawback in terms of the thinning design in the same manner as described above, because semiconductor chips are interposed between printed wiring boards.

On the other hand, the method which involves forming a device by means of a silicon substrate and stacking a required number of devices, is favorable in terms of the thinning design, because the thickness of the silicon substrate is reduced by polishing the back surface thereof. However, this method poses the following problems:

Namely, in this method, a mechanical polishing such as a back-grinding method is performed to make the silicon substrate thin, and accordingly, there is a limit to the thickness of the silicon substrate to be thinned due to mechanical shocks of the mechanical polishing. If the silicon substrate is made excessively thin, a problem would arise in that cracks occur in the silicon substrate and, in some cases, the silicon substrate may be broken or damaged.

Also, the surface on one side of the silicon substrate, on which device patterns are formed, is formed of an insulating film of polyimide resin, or the like, while the surface on another side is formed of a conductor. Namely, the two surfaces have different coefficients of thermal expansion, which causes a difference in stresses generated between the one surface and another surface. As a result, for example, when polishing treatment is performed, a problem arises in that the silicon substrate is warped.

SUMMARY OF THE INVENTION

An object of the present invention is to provide a semiconductor device and its manufacturing method, which can eliminate drawbacks arising in association with a thinning (damage to a semiconductor substrate, occurrence of cracks, warping of a semiconductor substrate, or the like) in performing three-dimensional mounting intended for the high density design and multiple-pin design.

To attain the above object, according to one aspect of the present invention, there is provided a method of manufacturing a semiconductor device, which includes the steps of: bonding, by means of a metal bump, two semiconductor substrates, on respective one-side surfaces of which a conductor layer patterned to a required shape is formed, while facing the respective one-side surfaces, each other; filling, with an insulating resin, a gap between the respective conductor layers bonded by means of the metal bump; polishing each of exposed side surfaces of the semiconductor substrates to thereby thin each of the semiconductor substrates to a prescribed thickness; forming a via hole which reaches the metal bump, in a required place of each of the thinned semiconductor substrates; forming an insulating film on the surface of each of the semiconductor substrates including an inner surface of the formed via hole; opening at least part of a portion in contact with the metal bump, of the insulating film formed within the via hole; filling an inside of the via hole with a conductor and further forming, on the insulating film, an electrode pad patterned to a required shape and electrically connected to the conductor; and stacking a structure obtained by the above-described steps, by a required number, by electrically connecting respective structures with each other through the electrode pad.

According to the method of manufacturing a semiconductor device according to this aspect, it is possible to accomplish a thinning design as the whole semiconductor device in a three-dimensionally mounted configuration which is finally manufactured, because two semiconductor substrates are first bonded together by means of a metal bump, while respective one-side surfaces, on which conductor layers (device patterns) are formed are faced each other, and an insulating resin is then filled into the gaps between the semiconductor substrates, and thereafter the thickness of each of the substrates is reduced by polishing both surfaces, i.e., each of the exposed side surfaces of the semiconductor substrates.

Also, since the insulating resin is filled into the gap between the facing conductor layers of the semiconductor substrates, it is possible to effectively absorb and buffer mechanical shocks caused by the polishing (thinning treatment) of each substrate, with the aid of the insulating resin. Namely, the insulating resin functions as a cushion (a buffer layer). As a result, even in the case that semiconductor substrates are thinned to a level close to the limit of the state-of-the art, it is possible to eliminate drawbacks as seen in the prior art, such as the occurrence of cracks and damage to a substrate. In other word, it is possible to improve the crack resistance of the semiconductor substrate.

Furthermore, since the object of polishing (thinning treatment) is a structure obtained by sticking the two semiconductor structures together symmetrically as if reflected in a mirror, while the respective one-side surfaces on which the conductor layers (device patterns) are formed are faced each other, it is possible to eliminate drawbacks as seen in the prior art, such as warping of a semiconductor substrate caused by a difference in stresses generated between the one surface and another surface of the substrate. In other words, it is possible to remedy the warping of the semiconductor substrate.

Also, according to another aspect of the present invention, there is provided a method of manufacturing a semiconductor device, which includes the steps of: bonding, by means of a metal bump, two semiconductor substrates, on respective one-side surfaces of which a conductor layer patterned to a required shape is formed, while facing the respective one-side surfaces, each other; filling, with an insulating resin, a gap between the respective conductor layers bonded by means of the metal bump; polishing each of exposed side surfaces of the semiconductor substrates to thereby thin only one of the semiconductor substrates to a prescribed thickness; forming a via hole which reaches the metal bump, in a required place of the thinned semiconductor substrate; forming an insulating film on the surface of each of the semiconductor substrates including an inner surface of the formed via hole; opening at least part of a portion in contact with the metal bump, of the insulating film formed within the via hole; and filling an inside of the via hole with a conductor and further forming, on the insulating film on the thinned semiconductor substrate, an electrode pad patterned to a required shape and electrically connected to the conductor.

According to the method of manufacturing a semiconductor device according to this aspect, in the same manner as in the method of manufacturing a semiconductor device according to the above-described aspect, it is possible to accomplish a thinning design as the whole semiconductor device in a three-dimensionally mounted configuration which is finally manufactured, because two semiconductor substrates are first bonded together by means of a metal bump, while respective one-side surfaces on which conductor layers (device patterns) are formed are faced each other, and an insulating resin is then filled into the gaps between the silicon substrates, and thereafter the thickness of one substrates is reduced by polishing each exposed surface of the silicon substrates. Also, owing to the presence of the insulating resin which functions as a buffer layer, it is possible to buffer mechanical shocks caused by the polishing (thinning treatment), and thus to eliminate drawbacks such as the occurrence of cracks in the semiconductor substrate. Furthermore, since the object of polishing (thinning treatment) is a structure obtained by sticking the two semiconductor structures together symmetrically as if reflected in a mirror, while the respective one-side surfaces on which the conductor layers (device patterns) are formed are faced each other, it is possible to eliminate drawbacks, such as warping of a semiconductor substrate caused by a difference in stresses generated between the one surface and another surface of the substrate.

Also, according to still another aspect of the present invention, there is provided a semiconductor device manufactured by a method of manufacturing a semiconductor device according to each of the above aspects.

DESCRIPTION OF THE PREFERRED EMBODIMENTS

Figure 1:
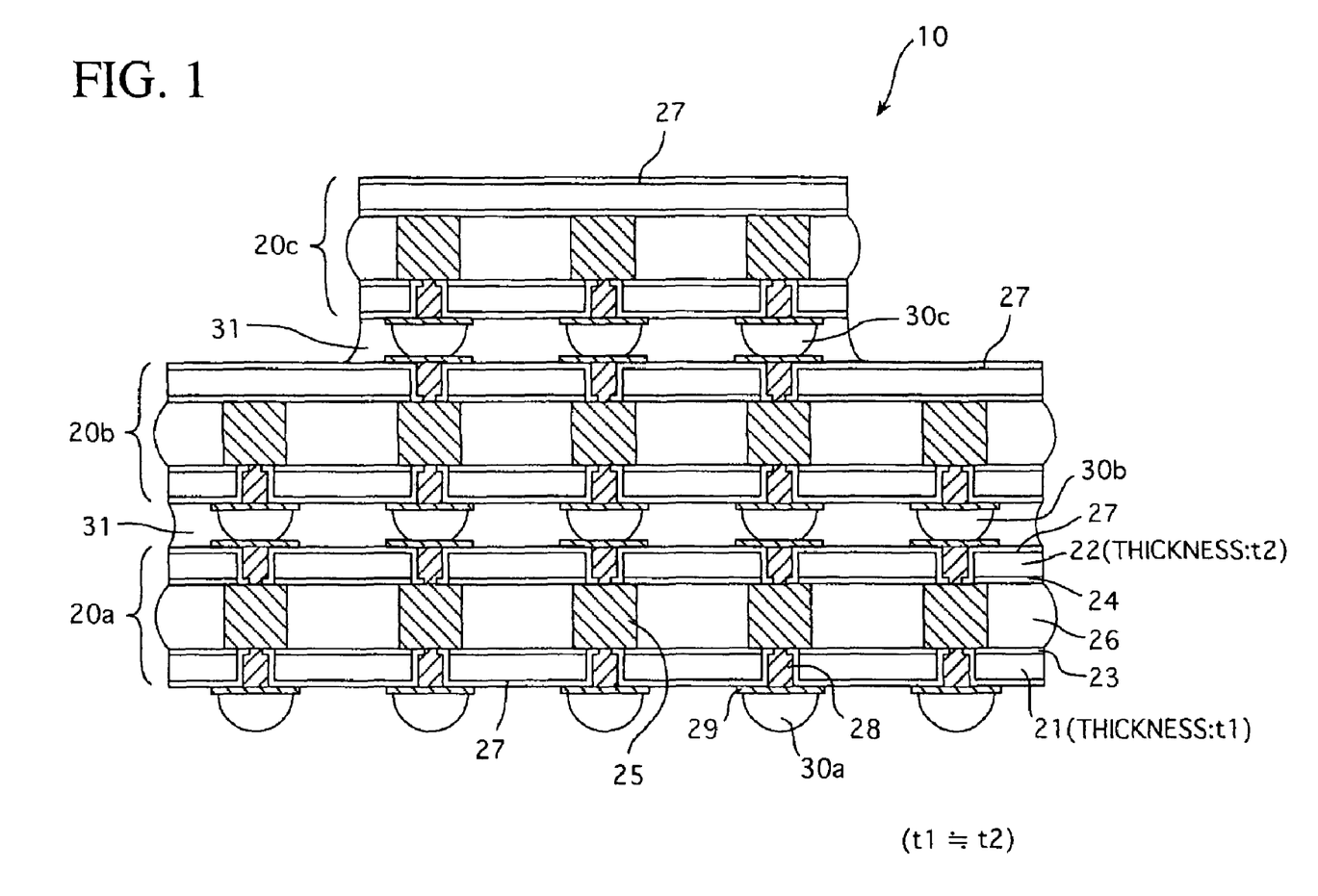
FIG. 1 is a sectional view showing the structure of a semiconductor device according to an embodiment of the present invention.

FIG. 1 schematically shows the sectional structure of a semiconductor device according to an embodiment of the present invention.

The semiconductor device 10 according to this embodiment has a three-dimensionally mounted configuration formed by stacking structures 20a, 20b, 20c in three stages, as shown in the figure. In each of the structures 20a, 20b, 20c, numerals 21 and 22 denote a silicon substrate thinned to a prescribed thickness, respectively; numerals 23 and 24 denote a conductor layer which is formed on one surface of the corresponding silicon substrate 21, 22, respectively, and which involves device patterns including required circuit patterns, wiring patterns, or the like; the numeral 25 denotes a metal bump which bonds the two silicon substrates 21, 22 through each of the conductor layers 23, 24 as will be described later; and numeral 26 denotes an insulative resin layer formed by being filled into a gap between the conductor layers 23, 24 bonded together by means of the metal bump 25. The metal bump 25 functions as a metal post, and the insulative resin layer 26 functions as a buffer layer to cushion mechanical shocks caused by the thinning treatment of a silicon substrate as will be described later, and also functions as a reinforcing agent.

Also, numeral 27 denotes an insulating film which functions as a protective film for each of the structures 20a, 20b, 20c; numeral 28 denotes a conductor filled into a via hole formed in each of the silicon substrates 21, 22; and numeral 29 denotes an electrode pad formed on each of the insulating films 27 and electrically connected to the conductor 28. The conductor 28 is electrically connected to the metal bump 25 through an opening (indicated by OP in FIG. 2F) formed in part of the insulating film 27 within the via hole. Therefore, the electrode pads 29 formed on both surfaces of each of the structures 20a, 20b, 20c are interconnected through the conductor 28 and the metal bump 25.

The thickness of each of the structures 20a, 20b, 20c is selected to be approximately 50 µm; the thickness (t1, t2) of the thinned silicon substrates 21, 22 is selected to be in the range of 3 µm to 20 µm; and the thickness of the insulative resin layer (buffer layer) 26 is selected to be approximately 30 µm.

Also, numerals 30a, 30b and 30c denote a metal bump bonded to the electrode pad 29 on the side of one surface (lower side in the illustrated example) of the corresponding structures 20a, 20b, 20c. Among these, the metal bump 30a bonded to the electrode pad 29 of the lowest-positioned structure 20a functions as an external terminal of this device 10. Also, numeral 31 denotes an insulative resin layer filled as an underfill into gaps between the stacked structures 20a, 20b, 20c.

In the above-described constitution, as the materials which constitute the metal bumps 25, 30a, 30b and 30c, Pb-free solders such as silver-tin (Ag—Sn) are used, in addition to eutectic solders, such as generally-used lead-tin (Pb—Sn). Alternatively, gold (Au), silver (Ag), copper (Cu), indium (In) or its alloys (In—Pb, In—Sn, or the like), nickel (Ni), and the like, may be used. Also, each of the bumps 25, 30a, 30b and 30c may be formed by a generally-used plating method utilizing photo processes, or may be a ball bump such as a stud bump formed by means of wire bonding techniques.

Also, Cu is typically used as the material for the device patterns (conductor layers 23, 24) including circuit patterns and wiring patterns. In order to further increase electrical conductivity and improve the reliability of connection to the metal bump 25, it is preferable to apply a coating of Au, Sn, or the like, for example. Furthermore, Au, Cu, Ni, chromium (Cr), aluminum (Al), or the like, is used as the material for the conductor 28 and the electrode pad 29. Also, epoxy resin, polyimide resin, or the like is used as the material for the insulative resin layer (buffer layer) 26 and the insulative resin layer (underfill material) 31. Furthermore, as the material for the insulating film (protective film) 27, photosensitive resin such as polyimide resin, epoxy resin, or the like, silicon oxide films formed by chemical vapor deposition (CVD) process, phosphorous silicate glass (PSG), or the like, is used.

Although in this embodiment the external connection terminal (metal bump 30a) is provided as shown in FIG. 1, it is not always necessary to provide the external connection terminal. This is because such an external connection terminal may be provided immediately before the semiconductor device 10 is mounted on a mother board such as a printed circuit board, in actual use. Therefore, as a final configuration of the semiconductor device 10, it is necessary only that the electrode pad 29 be exposed so that the external connection terminal (metal bump 30a) can be bonded.

Hereinafter, a method of manufacturing the semiconductor device 10 according to the present embodiment will be described with reference to FIG. 2A to FIG. 2K which show the manufacturing steps in sequence.

First, in the first step (FIG. 2A), two silicon substrates 21a and 22a, on respective one-side surfaces of which a conductor layer 23, 24 patterned to a required shape is formed, are bonded by means of a metal bump 25, while the respective one-side surfaces on which the conductor layer 23, 24 is formed are faced each other.

Figure 2A:
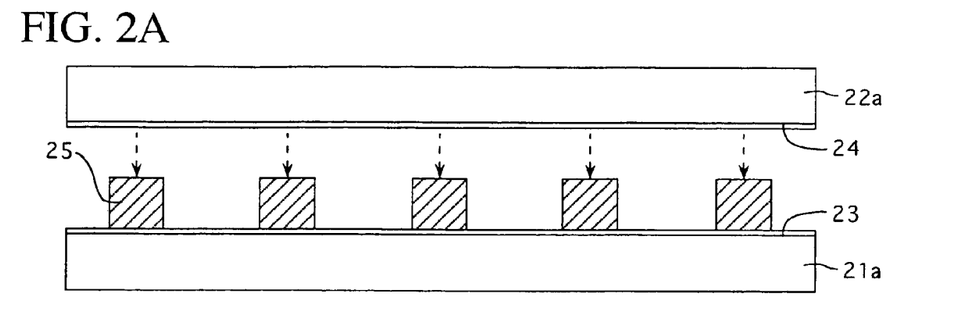
FIG. 2A to FIG. 2K are sectional views showing the manufacturing steps of the semiconductor device shown in FIG. 1.

Concretely, two relatively thick silicon substrates 21a, 22a having a thickness of approximately 100 µm to 300 µm are first prepared, and on respective one-side surfaces of the silicon substrates 21a, 22a are formed required device patterns (conductor layers 23, 24), by means of a well-known photolithography technique. Subsequently, a plurality of metal bumps 25 are bonded to prescribed positions on the conductor layer 23 of one silicon substrate 21a, for example, by ultrasonic bonding (i.e., bonding method which utilizes the thermal action or cavitation effect of ultrasonic waves), thermocompression bonding (wire bonding method, reflow soldering method), or the like. Subsequently, the two silicon substrates 21a, 22a are bonded together through the conductor layers 23, 24 by means of the metal bump 25, while the one-side surface to which the metal bump 25 of this silicon substrate 21a is bonded is faced with the one-side surface on which the conductor layer 24 of the other silicon substrate 22a is formed. Namely, a structure in which the two silicon substrates 21a, 22a are stuck together through the metal bump 25 is obtained.

In the next step (FIG. 2B), the structure obtained in the preceding step (formed by sticking the two silicon substrates 21a, 21b together through the metal bump 25) is placed in a vacuum chamber and an insulative resin such as epoxy resin is then filled into a gap between the conductor layers 23, 24 bonded by the metal bump 25, to thereby form an insulative resin layer 26 having a thickness of approximately 30 µm.

In the next step (FIG. 2C), both surfaces of the structure obtained in the preceding step, i.e., the surfaces of the exposed sides of the silicon substrate 21a, 22a, are thinned by performing mechanical polishing such as a back-grinding method, so as to constitute silicon substrates 21, 22 having a thickness (t1≈t2) of approximately 3 µm to 20 µm. The portions indicated by broken lines in the figure represent portions removed by the polishing.

In the next step (FIG. 2D), a via hole VH reaching the metal bump 25 is formed in a required place of each of the semiconductor substrates 21, 22 thinned in the preceding step. The via hole VH can be formed by drilling, for example, by means of a $CO_2$ laser, a YAG laser, an excimer laser, or the like, or by etching, for example, by means of a plasma etcher.

In the next step (FIG. 2E), by means of a CVD process, a silicon oxide film ($SiO_2$), i.e., an insulating film 27, is formed on the surface of the silicon substrates 21, 22 including the inner surface of the via hole VH formed therein.

Figure 2B:
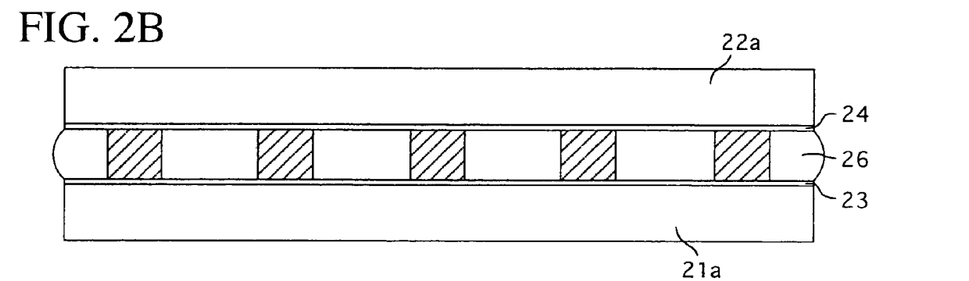

The insulating film 27 is formed to electrically insulate a conductor layer to be filled in the via hole VH in a subsequent step from the silicon substrates 21, 22, and also functions as a protective film as described above.

Although in this step a silicon oxide film is formed as the insulating film 27, for example, a phosphorus silicate glass (PSG) may be formed by means of CVD method, in place of the silicon oxide film. Alternatively, it is also possible to form the insulating film 27 by coating a resin (in particular, a photosensitive resin), such as polyimide resin, epoxy resin, or the like, on the whole surface.

In the next step (FIG. 2F), among the respective insulating films 27 on both surfaces formed in the preceding step, at least part of a portion in contact with the metal bump 25, of the insulating film 27 formed within the via hole VH, is opened (opening OP). The opening OP can be formed, by the same treatment as in the step of FIG. 2D, i.e., by drilling, for example, by means of a $CO_2$ laser, a YAG laser, or the like, or by etching, for example, by means of a plasma etcher.

As a result, a portion corresponding to the opening OP of the insulating film 27 in the via hole VH, i.e., part of the metal bump 25 is exposed.

Although in this step, the opening OP of the insulating film 27 is formed by a laser, plasma etching, or the like, where the insulating film 27 is formed by coating a photosensitive resin, it is also possible to form the opening OP by a well-known photolithography technique.

In the next step (FIG. 2G), by means of electroless plating or electrolytic plating, for example, a conductor layer CL is formed to fill the via hole VH formed in each of the silicon substrates 21, 22 (part of the insulating film 27 formed therein opens (opening OP)).

Concretely, the whole surface is first subjected to electroless nickel (Ni) plating, and then, the nickel layer is subjected to electroless gold (Au) plating, or to flash plating (plating of very small thickness) by electrolytic Au plating using the Ni layer as a power supply layer. Subsequently, electrolytic copper (Cu) plating is performed to fill the via hole VH using the Au layer as a power supply layer, to thereby form a three-layer (Ni/Au/Cu) conductor layer CL. The Ni layer in the conductor layer CL is intended to increase the adhesion to the underlying insulating film ($SiO_2$) 27, and the Au layer is formed to lower electric resistance during electrolytic Cu plating.

In the conductor layer CL thus formed, a conductor 28 buried in the via hole, VH is used to form an electrode pad on this conductor in a subsequent step. Also, since the treatment which is little more than plating is performed in this step, a conductor layer 28a is formed as shown in the figure also in portions other than the via hole VH on the insulating film 27.

In the next step (FIG. 2H), the whole surface is made flat by removing the unnecessary conductor layer 28a formed in portions other than the via hole VH on the insulating film 27 by means of mechanical polishing, chemical mechanical polishing (CMP), or the like, until the top end surface of the conductor 28 buried in the via hole VH on the insulating film 27 is exposed.

In the next step (FIG. 2I), on each of the insulating films 27 on both sides is formed an electrode pad 29 of a required shape, so as to be electrically connected to the conductor 28 buried in the via hole VH.

The electrode pad 29 can be formed, for example, by coating or forming a resist (not shown) on the whole surface, patterning the resist to a required shape, and performing a sputtering of Cu, Al, Au, Cr, or the like, by means of the resist as a mask. Alternatively, any plating may be performed in place of the sputtering.

As a result of the above-described steps, each of the structures 20a, 20b, 20c which constitute the semiconductor device 10 is fabricated. Although in the example of FIG. 2I, the structure 20a of the lowest stage is shown, the other structures 20b, 20c can also be similarly fabricated by the steps shown in FIG. 2A to FIG. 2I. Note, the structures 20b, 20c differ from the structure 20a in that the position where the via hole VH is formed in the step of FIG. 2D is different from that of the structure 20a.

In the next step (FIG. 2J), a metal bump 30a is bonded to the electrode pad 29 on the lower side of the structure 20a formed in the preceding step. Although not shown in the figure, metal bumps 30b, 30c are also similarly bonded to the other structures 20b, 20c. In this case, as described above, it is not always necessary to provide the metal bump 30a on the structure 20a of the lowest stage.

Solder, Au, Ag, In, or the like, is used as the material for the metal bumps 30a, 30b, 30c. For example, where In is used, because of the considerably low melting point of this metal compared with other metals, there is a merit in that, in performing bump bonding, it is possible to suppress a thermal effect on the resin layer (in this case, the insulative resin layer 26) in the structure.

In the final step (FIG. 2K), the structures 20a, 20b, 20c to which the metal bumps 30a, 30b, 30c are bonded, respectively, are stacked and electrically interconnected by thermocompression bonding, or the like, through the metal bumps 30b, 30c. The metal bump 30a of the structure 20a of the lowest stage is used as an external connection terminal.

Furthermore, an insulative resin as an underfill is filled into the gap between the stacked structures 20a, 20b, 20c, whereby the semiconductor device 10 (FIG. 1) of this embodiment is obtained.

As described above, according to the semiconductor device 10 (FIG. 1) of this embodiment and its manufacturing method (FIG. 2A to FIG. 2K), it is possible to accomplish a thinning design as the whole semiconductor device 10 in a three-dimensionally mounted configuration to be finally manufactured, because the silicon substrates 21a, 22a are bonded together by means of the metal bump 25, while the respective one-side surfaces on which the device pattern (the conductor layer 23, 24) is formed are faced each other; the insulative resin (buffer layer) 26 is filled into the gap between the silicon substrates 21a, 22a; and thereafter the thickness of each of the substrates is reduced by polishing the respective exposed surfaces of the silicon substrates 21a, 22a (the silicon substrates 21, 22).

Also, since the buffer layer 26 is interposed between the facing conductor layers 23, 24 of the silicon substrates 21a, 22a, it is possible to effectively absorb and buffer mechanical shocks caused by the polishing of each substrate, with the aid of the buffer layer 26. This contributes to an improvement in the crack resistance of the silicon substrates 21, 22. In other words, even if the silicon substrates are thinned to a level close to the limit of the state-of-the art, it is possible to eliminate drawbacks as seen in the prior art, such as occurrence of cracks, damage to a substrate, or the like.

Furthermore, since the object of polishing is the structure obtained by sticking the two silicon structures 21a, 22a together symmetrically as if reflected in a mirror, while the respective one-side surfaces on which the device pattern (the conductor layer 23, 24) is formed are faced each other, it is possible to eliminate drawbacks as seen in the prior art, such as a warping of the silicon substrate caused by a difference in stresses generated between the one surface and another surface of the substrate.

Figure 2C:
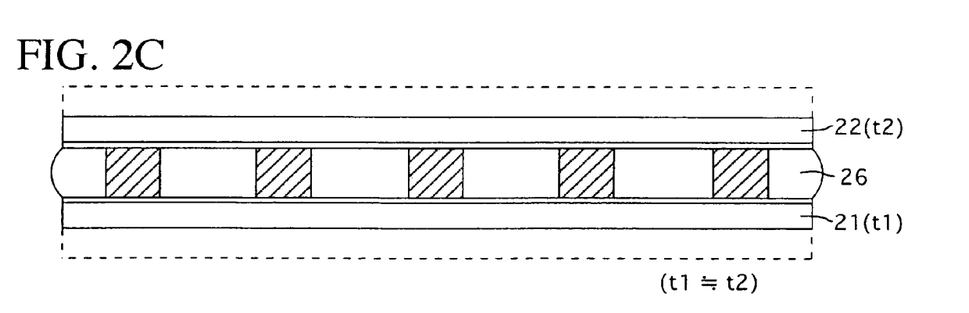
Figure 2D:
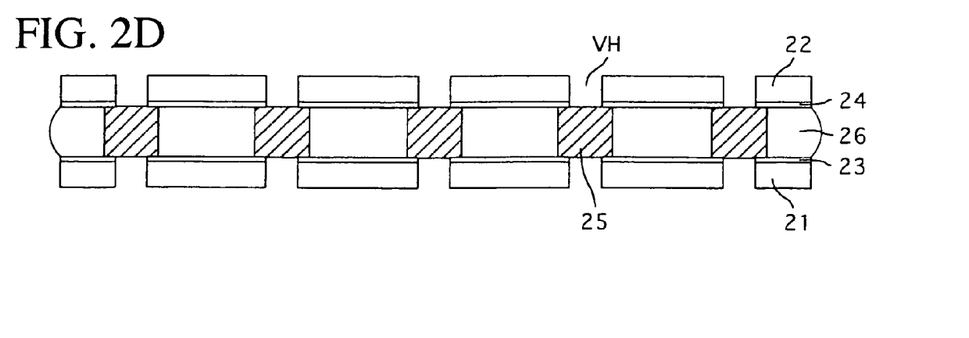
Figure 2E:
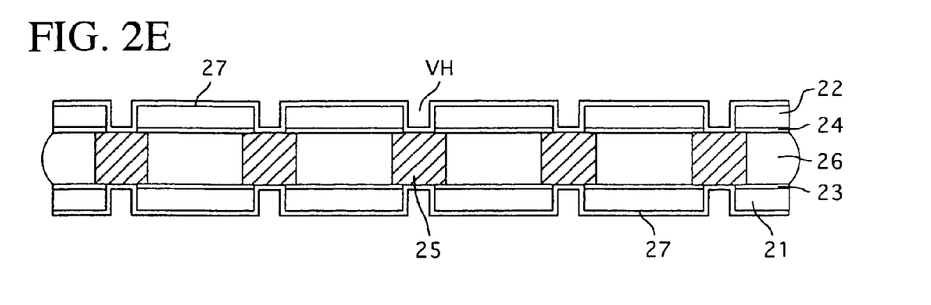
Figure 2F:
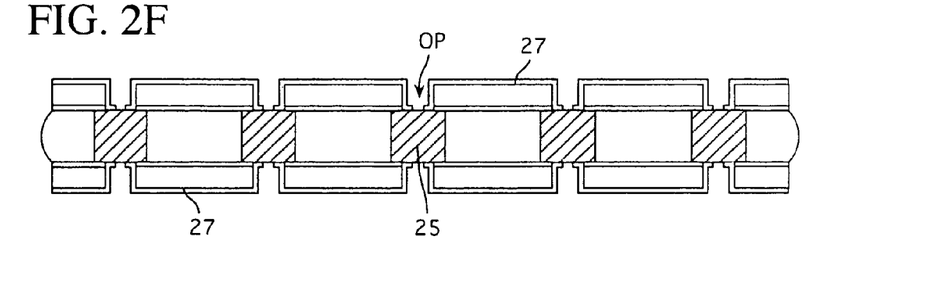
Figure 2G:
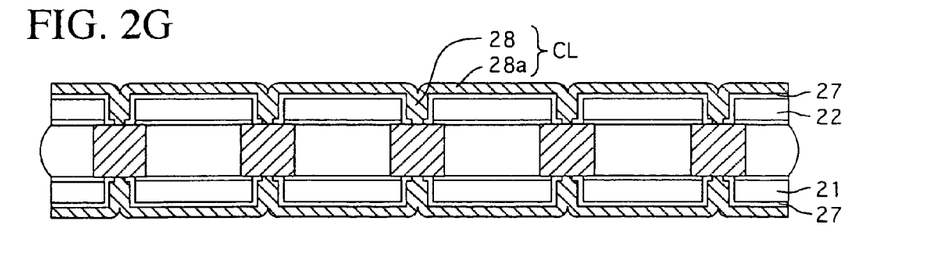

Furthermore, since the thickness of each of the silicon substrates 21, 22 is reduced to approximately 3 μm to 20 μm, it becomes easy to form the via hole VH in the thinned silicon substrates (FIG. 2C, FIG. 2D).

In the above-described embodiment, the explanation is made with respect to the case where the conductor layer CL of Ni/Au/Cu is formed by means of electroless plating and electrolytic plating in the step of FIG. 2G. However, it would be obvious that the method of forming the conductor layer CL is not limited to the above case. For example, a required film may be formed by sputtering, in place of the electroless plating.

As a concrete example, Cr, for example, is deposited by sputtering on the whole surface of each insulating layer 27 including the inner surface of the via hole VH and the surface of the exposed metal bump 25; Cu is further deposited on the Cr layer by sputtering, so as to form a metal thin film of two-layer structure; and a metal layer of Cu is formed on the entire surface by electrolytic plating, by means of the metal thin film as a power supply layer, whereby it is possible to form a conductor layer of Cr/Cu. In this case, as with the Ni layer in the above-described conductor layer CL, the Cr layer which is the underlayer portion of the metal thin layer is formed to increase adhesion to the underlying insulating film 27.

Also, in the above-described embodiment, the explanation is made with respect to the case where the structures 20a, 20b, 20c are stacked in three stages by aligning the positions of the metal bumps 25 and the electrode pads 29 of each structure. However, as a matter of course, it is not always necessary to align the positions of the metal bumps 25 and the positions of the electrode pads 29 (i.e., the positions of the metal bumps 30a, 30b, 30c), and as a matter of course, the number of stages to be stacked is not limited to three.

Also, it is not always necessary to stack such a structure in multiple stages, and the structure may be in a single stage depending on the required conditions. An example of such a single-stage structure is shown in FIG. 3.

Figure 3:
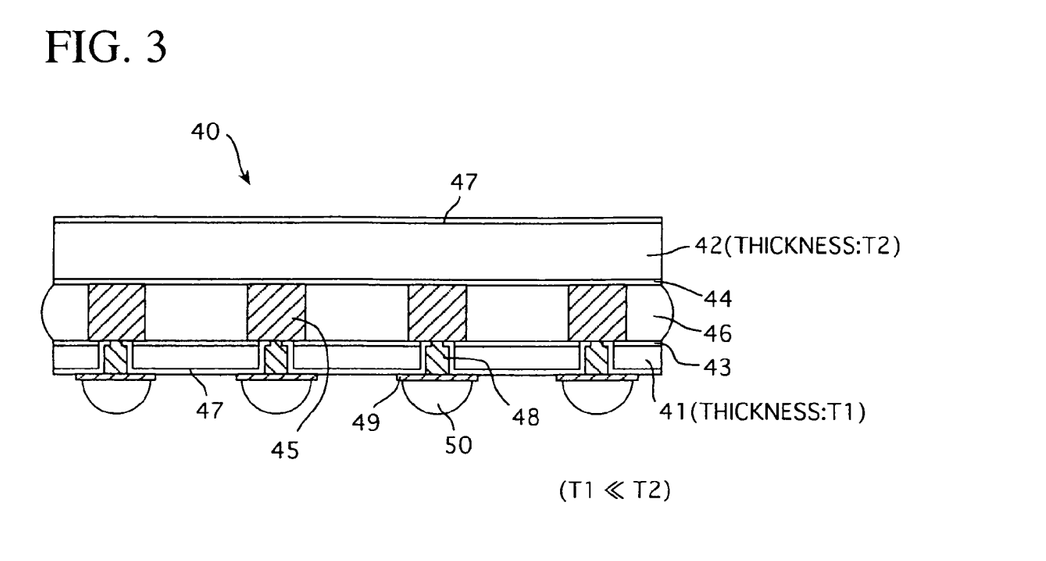
FIG. 3 is a sectional view showing the structure of a semiconductor device according to another embodiment of the present invention.

FIG. 3 schematically shows the sectional structure of the semiconductor device according to another embodiment of the invention.

The semiconductor device 40 according to this embodiment differs from the semiconductor device 10 according to the above-described embodiment (FIG. 1 and FIG. 2A to FIG. 2K) in that the structure (equivalent to each of the structures 20a, 20b, 20c shown in FIG. 2K) is not stacked in multiple stages, and in that, in polishing each of the silicon substrates 42a, 42b from both sides as will be described later, only one silicon substrate is thinned to a prescribed thickness (T1), while the thickness of the other silicon substrate is not reduced so as to have a certain thickness (T2). Since the other features are basically the same as those of the structure 20c of the highest stage shown in FIG. 1, the description thereof is omitted.

Hereinafter, a method of manufacturing the semiconductor device 40 according to this embodiment will be described with reference to FIG. 4A to FIG. 4G which show the manufacturing steps in sequence.

First, in the first step (FIG. 4A), in the same manner as with the treatment performed in the steps of FIG. 2A and FIG. 2B, two silicon substrates 41a, 42a are bonded together by means of a metal bump 45, while respective one-side surfaces on which a conductor layer 43, 44 (device pattern) is formed are faced each other, and an insulative resin 46 as a buffer layer is filled into a gap between the surfaces.

In the next step (FIG. 4B), both surfaces of the structure obtained in the preceding step (i.e., respective one-side surfaces to which the silicon substrate 41a, 42a is exposed) are polished by means of a back grinding method in such a manner that only one silicon substrate 41a is thinned to a prescribed thickness T1 (approximately 3 μm to 20 μm) to thereby obtain a silicon substrate 41, while for the other silicon substrate 42a, the amount of polishing is relatively reduced to have a certain thickness T2 (approximately 100 μm to 300 μm) to thereby obtain a silicon substrate 42. The portions indicated by broken lines in the figure represent portions removed by the polishing.

In the next step (FIG. 4C), a via hole VH which reaches the metal bump 45 is formed in a required place of one semiconductor substrates 41 thinned in the preceding step. In the same manner as in the treatment performed in the above-described step of FIG. 2D, the via hole VH can be formed by drilling, for example, by means of a laser, or by etching, for example, by means of a plasma etcher.

In the next step (FIG. 4D), in the same manner as in the treatment performed in the above-described steps of FIG. 2E and FIG. 2F, an insulating film 47 such as a silicon oxide film is formed by means of CVD process, for example, on the surface of each of the silicon substrates 41, 42 including the inner surface of the via hole VH. Furthermore, by means of a laser or a plasma etcher, for example, at least part of the portion in contact with the metal bump 45, of the insulating film 47 formed in the via hole VH, is opened (opening OP). As a result, part of the metal bump 45 is exposed.

Figure 2H:
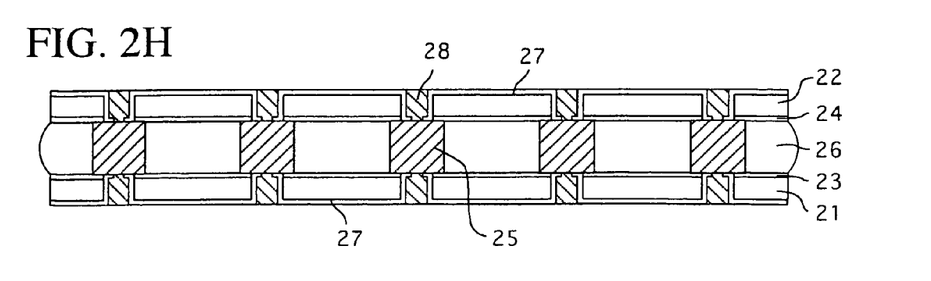
Figure 2I:
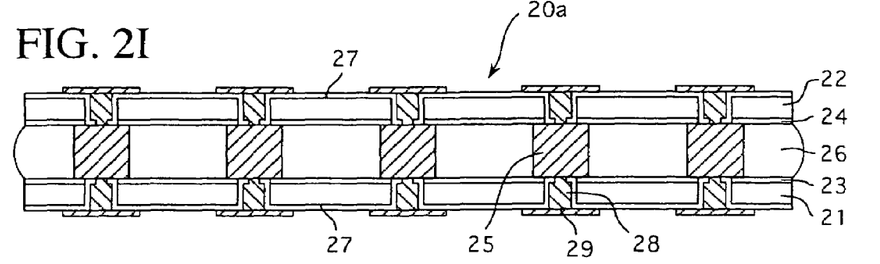
Figure 2J:
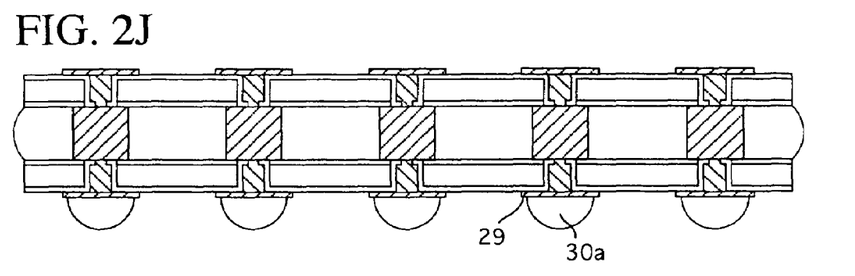
Figure 2K:
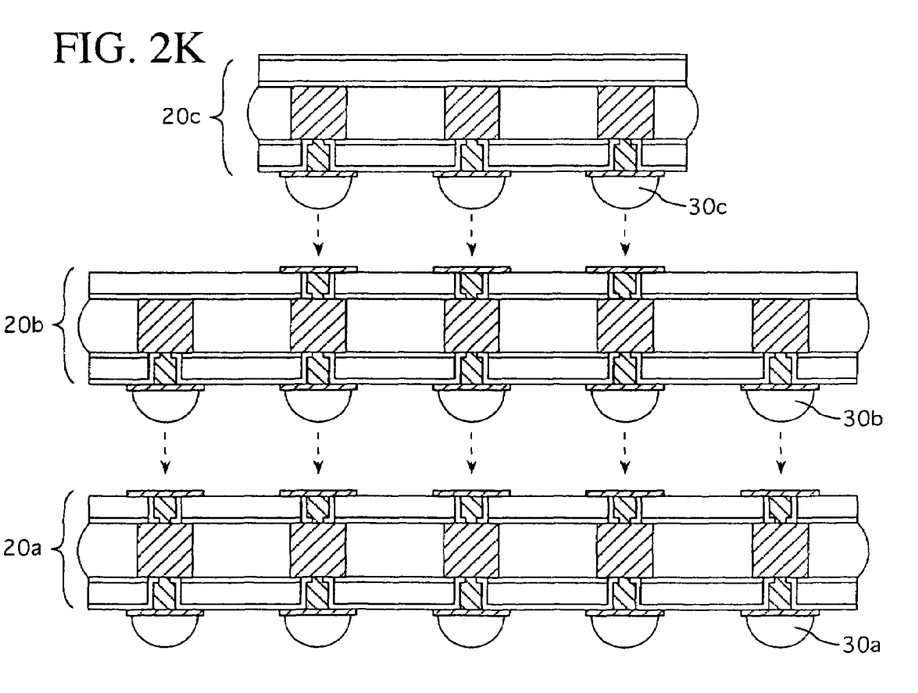

In the next step (FIG. 4E), in the same manner as in the treatment performed in the above-described steps of FIG. 2G and FIG. 2H, a conductor layer is formed by plating, for example, so as to fill the via hole VH formed in one silicon substrates 41 (part of the insulating film 47 formed therein opens (opening OP)), and a conductor 48 embedded in the via hole VH is formed by removing the unnecessary conductor layer formed in portions other than the via hole VH, by means of mechanical polishing, or the like.

In the next step (FIG. 4F), on the insulating film 47 on one silicon substrate 41 is formed an electrode pad 49 of a required shape, to as to be electrically connected to the conductor 48 embedded in the via hole VH. The electrode pad 49 can be formed by sputtering, plating, or the like, in the same manner as in the treatment performed in the above-described step of FIG. 2I.

In the final step (FIG. 4G), a metal bump 50 as an external connection terminal is bonded to the electrode pad 49 formed in the preceding step. As a result, the semiconductor device 40 (FIG. 3) of this embodiment is obtained.

According to the embodiment shown in FIG. 3 and FIG. 4A to FIG. 4G, as in the case of the above-described embodiment (FIG. 1 and FIG. 2A to FIG. 2K), it is possible to accomplish a thinning design as the whole semiconductor device 40 to be finally manufactured, because the silicon substrates 41a, 42a are bonded together by means of the metal bump 45, while the respective one-side surfaces on which the device pattern (the conductor layer 43, 44) is formed are faced each other; an insulative resin (buffer layer) 46 is filled into the gap between the silicon substrates 41a, 42a; and each of the exposed surfaces of the silicon substrates 41a, 42a is thinned (the silicon substrates 41, 42).

Figure 4A:
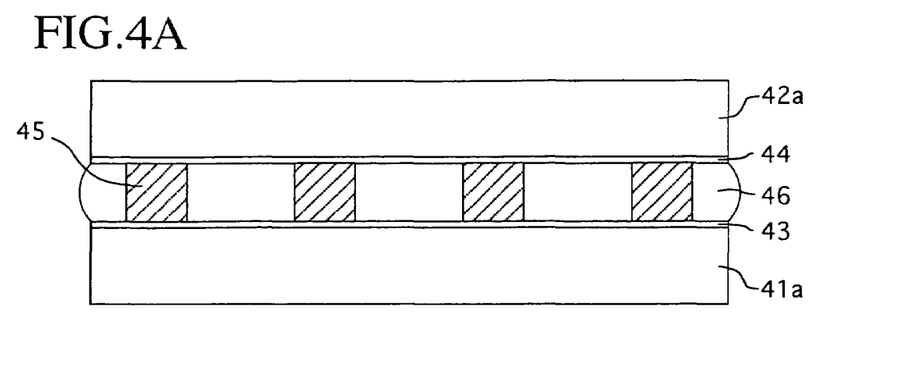
FIG. 4A to FIG. 4G are sectional views showing the manufacturing steps of the semiconductor device shown in FIG. 3.
Figure 4B:
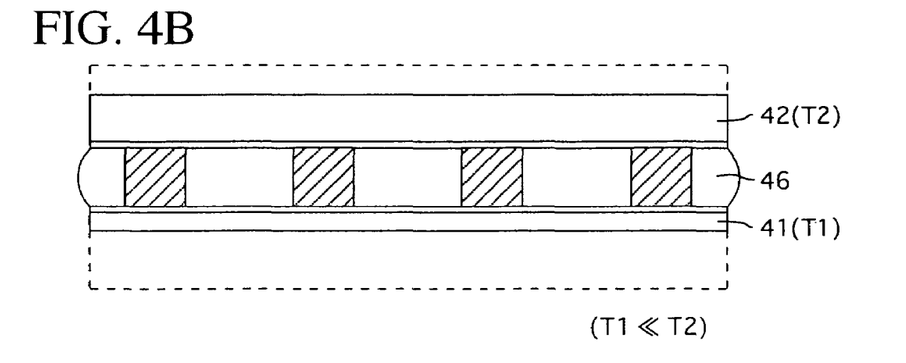
Figure 4C:
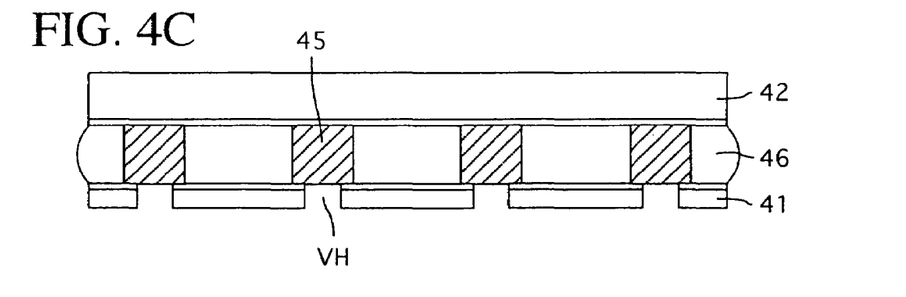
Figure 4D:
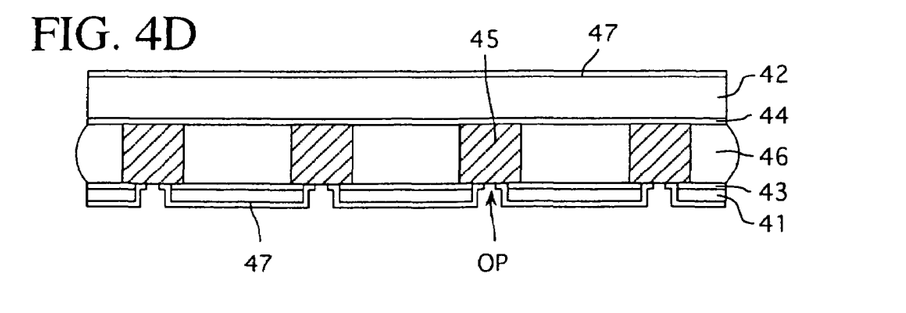
Figure 4E:
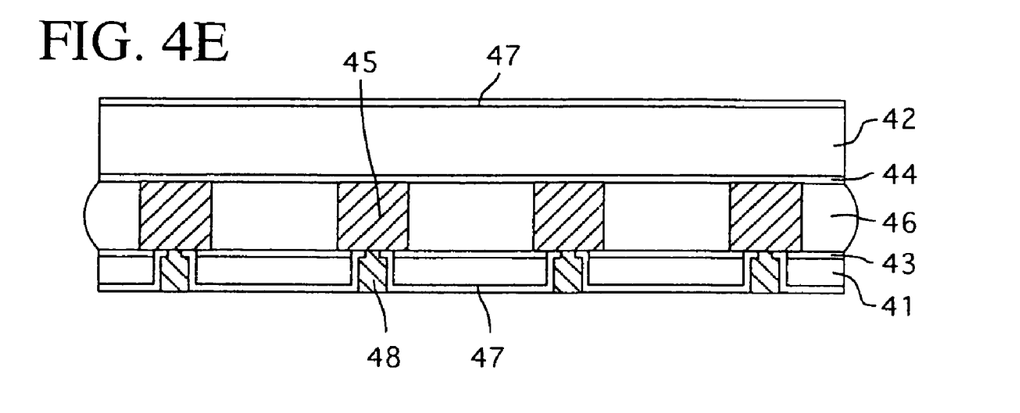
Figure 4F:
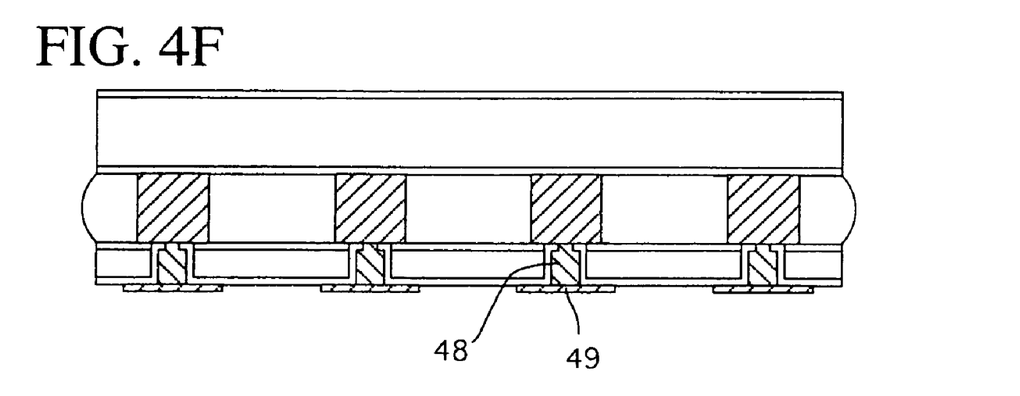
Figure 4G:
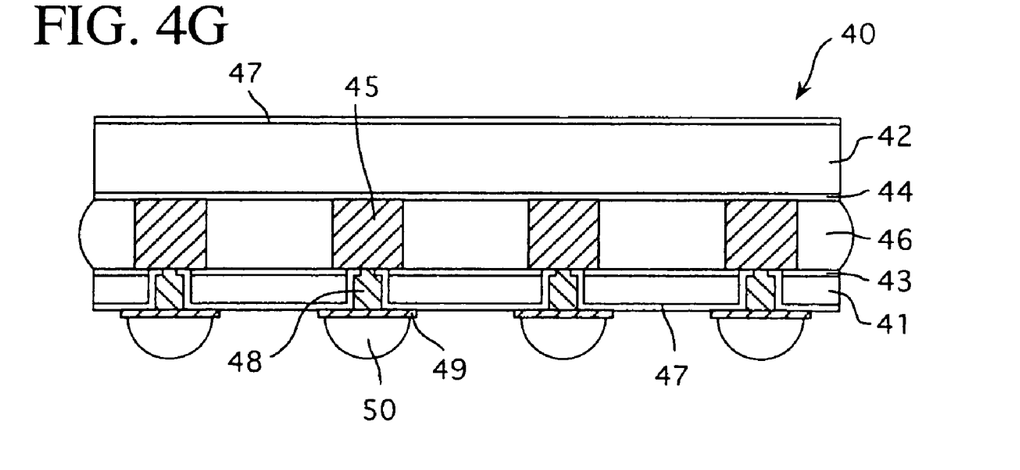

Also, because of the presence of the insulative layer (the buffer layer) 46, it is possible to effectively absorb and buffer mechanical shocks caused by the polishing of each of the substrates 41a, 42a, and hence it is possible to eliminate drawbacks such as occurrence of cracks, or the like, in the silicon substrates 41, 42. Furthermore, since the object of polishing is the structure obtained by sticking the two silicon structures 41a, 42a together symmetrically as if reflected in a mirror, while the respective one-side surfaces on which the device pattern (the conductor layer 43, 44) is formed are faced each other, it is possible to eliminate drawbacks such as a warping of the silicon substrate caused by a difference in stresses generated between the two surfaces. Similarly, since the thickness of the silicon substrate 41 is reduced to approximately 3 μm to 20 μm, it becomes easy to form the via hole VH in the thinned silicon substrates (FIG. 4B, FIG. 4C).

What is claimed is:

1. A method manufacturing a semiconductor device, comprising the steps of:

bonding, by means of a metal bump, two semiconductor substrates, on respective one-side surfaces of which a conductor layer patterned to a required shape is formed, while facing said respective one-side surfaces;

filling, with an insulating resin, a gap between the respective conductor layers bonded by means of the metal bump;

polishing each of exposed side surfaces of said semiconductor substrates to thereby thin each of the semiconductor substrates to a prescribed thickness;

forming a via hole which reaches the metal bump, in a required place of each of said thinned semiconductor substrates;

forming an insulating film on the surface of each of said semiconductor substrates including an inner surface of said formed via hole;

opening at least part of a portion in contact with the metal bump, of the insulating film formed within said via hole;

filling an inside of said via hole with a conductor and further forming, on said insulating film, an electrode pad patterned to a required shape and electrically connected to the conductor; and stacking a structure obtained by the above-described steps, by a required number, by electrically connecting respective structures with each other through said electrode pad.

2. The method according to claim 1, further comprising, after the step of stacking the required number of structures, the step of bonding a metal bump as an external connection terminal to the electrode pad formed on an exposed side surface of the lowest-positioned structure.

3. The method according to claim 1, wherein in the step of stacking the required number of structures, respective electrode pads facing each other, of an upper-positioned structure and a lower-positioned structure, are bonded by means of a metal bump.

4. The method according to claim 3, wherein after the step of stacking the required number of structures, an insulating resin is filled into gaps between the stacked structures.

5. The method according to claim 1, wherein conductor layers to be formed on the respective one-side surfaces of said two semiconductor substrates are patterned so as to mutually exhibit the same shape when arranged to be faced each other during bonding.

6. The method according to claim 1, wherein in the step of thinning each of said semiconductor substrates to a prescribed thickness, the prescribed thickness is selected in the range of 3 μm to 20 μm.

7. A method of manufacturing a semiconductor device, comprising the steps of:

bonding, by means of a metal bump, two semiconductor substrates, on respective one-side surfaces of which a conductor layer patterned to a required shape is formed, while facing said respective one-side surfaces;

filling, with an insulating resin, a gap between the respective conductor layers bonded by means of the metal bump;

polishing each of exposed side surfaces of said semiconductor substrates to thereby thin only one of the semiconductor substrates to a prescribed thickness;

forming a via hole which reaches the metal bump, in a required place of said thinned semiconductor substrate;

forming an insulating film on the surface of each of said semiconductor substrates including an inner surface of said formed via hole;

opening at least part of a portion in contact with the metal bump, of the insulating film formed within said via hole; and filling an inside of said via hole with a conductor and further forming, on the insulating film on said thinned semiconductor substrate, an electrode pad patterned to a required shape and electrically connected to the conductor.

8. The method according to claim 7, further comprising, after the step of forming the electrode pad, the step of bonding a metal bump as an external connection terminal to the electrode pad.

* * * * *